United States Patent
Kim et al.

(10) Patent No.: US 8,847,228 B2
(45) Date of Patent: Sep. 30, 2014

(54) THIN FILM TRANSISTOR ARRAY PANEL

(71) Applicant: Samsung Display Co., Ltd., Yongin (KR)

(72) Inventors: Kyung Seop Kim, Hwaseong-si (KR); Byeong-Beom Kim, Asan-si (KR); Joon Yong Park, Gunpo-si (KR); Chang Oh Jeong, Suwon-si (KR); Hong Long Ning, Suwon-si (KR); Dong Min Lee, Anyang-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/691,307

(22) Filed: Nov. 30, 2012

(65) Prior Publication Data

US 2013/0320344 A1 Dec. 5, 2013

(30) Foreign Application Priority Data

Jun. 5, 2012 (KR) ........................ 10-2012-0060267

(51) Int. Cl.
| | |
|---|---|
| *H01L 29/04* | (2006.01) |
| *H01L 31/036* | (2006.01) |
| *H01L 31/0376* | (2006.01) |
| *H01L 31/20* | (2006.01) |
| *H01L 29/49* | (2006.01) |
| *H01L 29/45* | (2006.01) |
| *H01L 29/786* | (2006.01) |

(52) U.S. Cl.
CPC ...... *H01L 29/78693* (2013.01); *H01L 29/4908* (2013.01); *H01L 29/458* (2013.01); *H01L 29/7869* (2013.01)
USPC .. 257/59; 257/72; 257/E29.117; 257/E29.273

(58) Field of Classification Search
CPC ........................ H01L 27/1214; H01L 29/4908
USPC ......... 257/59, 60, 72, 347, E29.117, E29.273
See application file for complete search history.

(56) References Cited

U.S. PATENT DOCUMENTS

| | | | |
|---|---|---|---|
| 6,455,357 B2 * | 9/2002 | Kang et al. | ..................... 438/158 |
| 7,652,740 B2 | 1/2010 | Hwang et al. | |
| 7,919,795 B2 | 4/2011 | Lee et al. | |
| 7,956,949 B2 | 6/2011 | Cho et al. | |
| 2006/0086978 A1 | 4/2006 | Kobayashi | |
| 2008/0099765 A1 | 5/2008 | Kim et al. | |
| 2011/0068340 A1 | 3/2011 | Lee et al. | |
| 2011/0114940 A1 | 5/2011 | Kim et al. | |
| 2011/0133190 A1 | 6/2011 | Mori et al. | |
| 2011/0133193 A1 | 6/2011 | Song et al. | |
| 2011/0140111 A1 | 6/2011 | Jeong et al. | |
| 2011/0193088 A1 | 8/2011 | Mori et al. | |

(Continued)

FOREIGN PATENT DOCUMENTS

| | | |
|---|---|---|
| JP | 2010-212284 A | 9/2010 |
| JP | 2011-203746 A | 10/2011 |
| KR | 10-1990-0017198 A | 11/1990 |
| KR | 1019900017198 A | 11/1990 |
| KR | 10-2005-0055384 A | 6/2005 |
| KR | 10-0737642 | 7/2007 |

(Continued)

*Primary Examiner* — Hoai V Pham
(74) *Attorney, Agent, or Firm* — Innovation Counsel LLP

(57) ABSTRACT

A thin film transistor array panel includes: a semiconductor layer disposed on an insulation substrate; a gate electrode overlapping the semiconductor layer; a source electrode and a drain electrode overlapping the semiconductor layer; a first barrier layer disposed between the source electrode and the semiconductor layer; and a second barrier layer disposed between the drain electrode and the semiconductor layer, wherein the first barrier layer and the second barrier layer include nickel-chromium (NiCr).

15 Claims, 5 Drawing Sheets

(56) References Cited

U.S. PATENT DOCUMENTS

2011/0309444 A1 12/2011 Maki et al.
2012/0286272 A1 11/2012 Ning et al.
2013/0048998 A1* 2/2013 Katoh .............................. 257/59

FOREIGN PATENT DOCUMENTS

| KR | 10-0848100 | 7/2008 |
|---|---|---|
| KR | 10-2011-0044633 A | 4/2011 |
| KR | 1020130062726 A | 5/2011 |

* cited by examiner

THIN FILM TRANSISTOR ARRAY PANEL

CROSS-REFERENCE TO RELATED APPLICATION

This application claims priority to and the benefit of Korean Patent Application No. 10-2012-0060267 filed in the Korean Intellectual Property Office on Jun. 5, 2012, the entire contents of which are incorporated herein by reference.

BACKGROUND OF THE INVENTION (a) Field of the Invention

The present invention relates to a thin film transistor array panel.

(b) Description of the Related Art

A display device usually includes a thin film transistor associated with each pixel, for switching voltages to be applied to the pixel on and off. The thin film transistor includes a gate electrode to which a switching signal is applied, a source electrode to which a data voltage is applied, and a drain electrode outputting the data voltage, thereby forming a switching element. Also, the thin film transistor includes an active layer as a channel layer overlapping the gate electrode, the source electrode, and the drain electrode. The active layer includes amorphous silicon as a semiconductor material.

However, as the size of a display becomes larger, thin film transistors having higher electron mobility are required. In particular, the amorphous silicon currently used as the active layer has low electron mobility, and is manufactured by vacuum-based depositing instruments, such as CVD, sputtering, etc., which are expensive.

Accordingly, it may be desirable to develop an oxide semiconductor with a high electron mobility that can be easily manufactured and that can be applied with coating process or printing process of low cost. Also, a method that increases current mobility speed by forming wiring using a metal having low resistivity has increased.

However, when forming the electrode of the thin film transistor using a metal that has a low resistivity, an unnecessary reaction is generated between the oxide semiconductor and the metal of the electrode. As a result, adherence between the oxide semiconductor and the metal of the electrode is low, such that they may be separated from each other. This can increase the resistivity of the electrode and the performance of the semiconductor is deteriorated.

The above information disclosed in this Background section is only for enhancement of understanding of the background and therefore it may contain information that does not form the prior art that is already known to a person of ordinary skill in the art.

SUMMARY OF THE INVENTION

A thin film transistor array panel that includes electrodes made of metal having low resistivity is provided, in which performance deterioration of the thin film transistors is by preventing an unnecessary and undesirable reaction between an oxide semiconductor and the metal forming the electrodes, and by increasing the adherence between the oxide semiconductor and the metal of the electrodes.

A thin film transistor array panel includes: a semiconductor layer disposed on an insulation substrate; a gate electrode overlapping the semiconductor layer; a source electrode and a drain electrode overlapping the semiconductor layer; a first barrier layer disposed between the source electrode and the semiconductor layer; and a second barrier layer disposed between the drain electrode and the semiconductor layer, wherein the first barrier layer and the second barrier layer include nickel-chromium (NiCr).

The semiconductor may include an oxide semiconductor.

The source electrode and the drain electrode may include at least one of copper, aluminum, and silver.

The first barrier layer and the second barrier layer may include at least one element selected from vanadium (V), titanium (Ti), zirconium (Zr), aluminum (Al), iron (Fe), indium (In), tantalum (Ta), manganese (Mn), magnesium (Mg), chromium (Cr), molybdenum (Mo), cobalt (Co), nickel (Ni), tin (Sn), tungsten (W), niobium (Nb), and neodymium (Nd).

The thin film transistor array panel may further include a first protection layer disposed on a surface of the source electrode where the first barrier layer is not disposed among the surfaces of the source electrode and a second protection layer disposed on a surface of the drain electrode where the second barrier layer is not disposed among the surfaces of the drain electrode, and the first protection layer and the second protection layer may include nickel-chromium.

The thin film transistor array panel may further include a third barrier layer disposed under the gate electrode, wherein the gate electrode includes at least one of copper, aluminum, and silver, and wherein the third barrier layer includes nickel-chromium.

A third passivation layer disposed on the gate electrode may be further included, and the third passivation layer may include nickel-chromium.

DETAILED DESCRIPTION OF THE EMBODIMENTS

Figure 1:
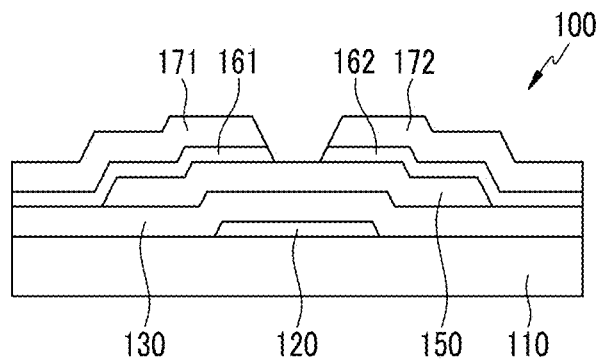
FIG. 1 is a cross-sectional view of a thin film transistor array panel according to an exemplary embodiment.

Exemplary embodiments will be described more fully hereinafter with reference to the accompanying drawings, in which exemplary embodiments are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or array panel is referred to as being "on" another element, it can be directly on the other element, or intervening elements may also be present. In contrast, when an element is referred to as being "directly on" another element, there are no intervening elements present.

FIG. 1 is a cross-sectional view of a thin film transistor array panel according to an exemplary embodiment.

Referring to FIG. 1, a thin film transistor array panel 100 includes an insulation substrate 110, a gate electrode 120, a gate insulating layer 130, a semiconductor layer 150, a source electrode 171, a drain electrode 172, a first barrier layer 161, and a second barrier layer 162.

The insulation substrate 110 may be made of, for example, a plastic. The gate electrode 120 is disposed on the insulation substrate 110. The gate electrode 120 may be connected to a gate wire transmitting a gate signal. The gate electrode 120 may be formed of, for example, a metal of an aluminum series such as aluminum (Al) and an aluminum alloy, a metal of a silver series such as silver (Ag) and an silver alloy, a metal of a copper series such as copper (Cu) and an copper alloy, a metal of a molybdenum series such as molybdenum (Mo) and an molybdenum alloy, chromium (Cr), titanium (Ti), tantalum (Ta), etc.

However, the gate electrode 120 according to an exemplary embodiment is not limited thereto, and the gate electrode 120 may be made of various metals and conductors.

The gate insulating layer 130 is formed on the gate wire including the gate electrode 120 and the insulation substrate 110. The gate insulating layer 130 may be formed of, for example, silicon oxide (SiOx), silicon nitride (SiNx), or silicon oxynitride (SiON). Also, the gate insulating layer 130 may have a multi-layered structure of, for example, silicon nitride and silicon oxide. In this case, a silicon nitride layer is formed on the insulation substrate 110 and a silicon oxide layer is formed on the silicon nitride layer, such that the silicon oxide layer may contact a semiconductor layer that will be described below.

In the case in which the gate insulating layer 130 is an silicon oxynitride layer, the oxygen content in the silicon oxynitride layer may have a concentration gradient. Specifically, the oxygen content in the gate insulating film 130 may become higher closer to the oxide semiconductor layer 150. The oxide semiconductor layer 150 and the silicon oxynitride layer having the higher oxygen content are in contact, and therefore it is possible to prevent deterioration of the channel layer by reducing the oxygen deficiency in the oxide semiconductor layer 150. The semiconductor layer 150 is formed on the gate insulating layer 130. The semiconductor layer 150 overlaps the gate electrode 120.

The semiconductor layer 150 may be, for example, an oxide semiconductor. The oxide semiconductor 150 may include, for example, oxide of zinc (Zn), gallium (Ga), tin (Sn), or indium (In) as a basis, or zinc oxide (ZnO), indium-gallium-zinc oxide (InGaZnO4), indium-zinc oxide (Zn—In—O), or zinc-tin oxide (Zn—Sn—O) that are complex oxides thereof. The oxide semiconductor 154 may be layered by a solution process such as by Inkjet printing. In detail, the semiconductor layer 150 may be the oxide semiconductor such as IGZO (In—Ga—Zn—O), GZO (Ga—Zn—O), IZO (In—Zn—O), or HIZO (Hf—In—Zn—O).

However, the semiconductor layer 150 may, for example, include amorphous silicon or polycrystalline silicon.

The source electrode 171 and the drain electrode 172 are disposed on the semiconductor layer 150. The source electrode 171 may be connected to a data wire transmitting a data signal.

The source electrode 171 and the drain electrode 172 may be made of a metal having low resistivity such as, for example, a copper-containing metal including copper (Cu) or copper alloys, an aluminum-containing metal including aluminum (Al) or aluminum alloys, or a silver-containing metal including silver (Ag) or silver alloys.

However, the source electrode 171 and the drain electrode 172 according to an exemplary embodiment are not limited thereto, and the source electrode 171 and the drain electrode 172 may be made of various metals and conductors having low resistivity.

The drain electrode 172 may be electrically connected to a pixel electrode (not shown), and a voltage applied to the pixel electrode and a voltage applied to an opposed electrode (not shown) form an electric field, thereby realizing gray expression (with respect to light transmittance through, for instance, a liquid crystal layer between the electrodes or by excitation of a light emitting diode) according to the electric field.

The first barrier layer 161 is disposed between the source electrode 171 and the semiconductor layer 150, and the second barrier layer 162 is disposed between the drain electrode 172 and the semiconductor layer 150. The first barrier layer 161 and the second barrier layer 162 include, for example, nickel-chromium (NiCr). In detail, the first barrier layer 161 and the second barrier layer 162 may include, for example, nickel-chromium (NiCr) or a nickel-chromium alloy, and in a case of a nickel-chromium alloy, at least one selected from, for example, vanadium (V), titanium (Ti), zirconium (Zr), aluminum (Al), iron (Fe), indium (In), tantalum (Ta), manganese (Mn), magnesium (Mg), molybdenum (Mo), cobalt (Co), tin (Sn), tungsten (W), niobium (Nb), and neodymium (Nd) may be included in addition to nickel-chromium.

The first barrier layer 161 and the second barrier layer 162 increase a contact characteristic between the semiconductor layer 150, and the source electrode 171 and the drain electrode 172, and prevent components of the source electrode 171 and the drain electrode 172 from reacting with components of the semiconductor layer 150.

In general, in a conventional thin film transistor array panel, the source electrode and the drain electrode include an underlying layer made of a metal such as titanium, chromium, tantalum, and a molybdenum-containing metal. However, the component of the underlying layer is easily diffused into a resistivity metal layer included in the source electrode and the drain electrode in a subsequent high-temperature process. Accordingly, the resistivity of the source electrode and the drain electrode is increased such that the performance of the display device including the thin film transistor may be deteriorated.

However, the first barrier layer 161 and the second barrier layer 162 according to an exemplary embodiment include nickel-chromium, and thereby the resistivity metal layer such as copper, aluminum, and silver is not diffused by nickel-chromium in the subsequent high temperature process. Further, the in resistivity of the source electrode and the drain electrode is prevented, and thereby the deterioration of the performance of the display device including the thin film transistor is prevented.

Also, nickel-chromium included in the first barrier layer 161 and the second barrier layer 162 has an excellent contact characteristic with the resistivity metal layer such as copper, aluminum, and silver.

Also, nickel-chromium included in the first barrier layer 161 and the second barrier layer 162 may be simultaneously etched along with the resistivity metal layer such as copper, aluminum, and silver by the same etchant. Therefore lifting of the source electrode and the drain electrode due to an undercut of a barrier layer disposed under the source electrode and the drain electrode may be prevented and the manufacturing process is simplified. In detail, nickel-chromium included in the first barrier layer 161 and the second barrier layer 162 may be etched by using an etchant including, for example, phosphoric acid, nitric acid, or acetic acid. The etchant including the phosphoric acid, nitric acid, or acetic acid may be used in repeated etching processes a greater number of times than an etchant of a different kind, thereby decreasing manufacturing cost.

In the present exemplary embodiment, the gate electrode 120, the gate insulating layer 130, the semiconductor layer 150, and the source electrode 171 and drain electrode 172 are sequentially deposited, however the present disclosure is not limited thereto, and the deposition structure of the thin film transistor may be changed.

The source electrode 171 and the drain electrode 172 are separated from each other and partially overlap the semiconductor layer 150. That is, the source electrode 171 partially overlaps the semiconductor layer 150, and the drain electrode 172 is disposed to face the source electrode 171 with respect to the channel portion of the thin film transistor and partially overlaps the semiconductor layer 150.

Although not shown, a passivation layer may be disposed on the source electrode 171 and the drain electrode 172, and on the channel region of the semiconductor layer 150 that is not overlapped by the source electrode 171 and the drain electrode 172.

Figure 2:
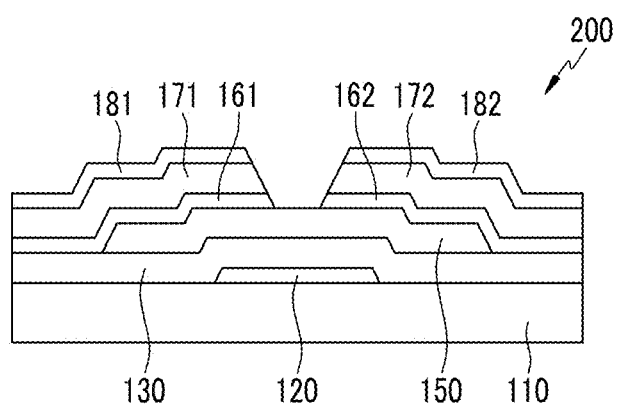
FIG. 2 is a cross-sectional view of a thin film transistor array panel according to another exemplary embodiment.

Next, referring to FIG. 2, another exemplary embodiment will be described. FIG. 2 is a cross-sectional view of a thin film transistor array panel according to another exemplary embodiment.

Referring to FIG. 2, the thin film transistor array panel 200 according to the present exemplary embodiment is similar to the thin film transistor array panel 100 according to the exemplary embodiment shown in FIG. 1.

Referring to FIG. 2, the thin film transistor array panel 200 according to the present exemplary embodiment includes a insulation substrate 110, the gate electrode 120, the gate insulating layer 130, the semiconductor layer 150, the source electrode 171, the drain electrode 172, the first barrier layer 161, and the second barrier layer 162.

The gate electrode 120 may be connected to the gate wire transmitting the gate signal. The gate electrode 120 may be formed of, for example, a metal of an aluminum series such as aluminum (Al) and an aluminum alloy, a metal of a silver series such as silver (Ag) and an silver alloy, a metal of a copper series such as copper (Cu) and an copper alloy, a metal of a molybdenum series such as molybdenum (Mo) and an molybdenum alloy, chromium (Cr), titanium (Ti), tantalum (Ta), etc.

The gate insulating layer 130 may be formed, for example, of silicon oxide (SiOx), silicon nitride (SiNx), or silicon oxynitride (SiON).

The semiconductor layer 150 overlaps the gate electrode 120.

The semiconductor layer 150 may be, for example, the oxide semiconductor. The oxide semiconductor 150 may include, for example, an oxide of zinc (Zn), gallium (Ga), tin (Sn) or indium (In) as a basis, or zinc oxide (ZnO), indium-gallium-zinc oxide (InGaZnO4), indium-zinc oxide (Zn—In—O), or zinc-tin oxide (Zn—Sn—O) that are complex oxides thereof. The oxide semiconductor 154 may be layered by a solution process such as by Inkjet printing. In detail, the semiconductor layer 150 may be the oxide semiconductor such as IGZO, GZO, IZO, or HIZO.

Further, the semiconductor layer 150 may include, for example, amorphous silicon or polycrystalline silicon.

The source electrode 171 and the drain electrode 172 may be made of a metal having low resistivity such as, for example, a copper-containing metal including copper (Cu) and copper alloys, an aluminum-containing metal including aluminum (Al) and aluminum alloys, or a silver-containing metal including silver (Ag) and silver alloys.

The first barrier layer 161 and the second barrier layer 162 include, for example, nickel-chromium (NiCr). In detail, the first barrier layer 161 and the second barrier layer 162 may include, for example, nickel-chromium (NiCr) or a nickel-chromium alloy, and in a case of the nickel-chromium alloy, at least one selected from, for example, vanadium (V), titanium (Ti), zirconium (Zr), aluminum (Al), iron (Fe), indium (In), tantalum (Ta), manganese (Mn), magnesium (Mg), molybdenum (Mo), cobalt (Co), tin (Sn), tungsten (W), niobium (Nb), and neodymium (Nd) may be included in addition to nickel-chromium.

The first barrier layer 161 and the second barrier layer 162 increase a contact characteristic between the semiconductor layer 150, and the source electrode 171 and the drain electrode 172, and prevent components of the source electrode 171 and the drain electrode 172 from reacting with components of the semiconductor layer 150.

The source electrode 171 and the drain electrode 172 are separated from each other and partially overlap the semiconductor layer 150. That is, the source electrode 171 partially overlaps the semiconductor layer 150, and the drain electrode 172 is disposed to face the source electrode 171 with respect to the channel portion of the thin film transistor and partially overlaps the semiconductor layer 150.

However, the thin film transistor array panel according to the present exemplary embodiment, differently from the thin film transistor array panel according to the exemplary embodiment shown in FIG. 1, further includes a first protection layer 181 disposed on the source electrode 171 and a second protection layer 182 disposed on the drain electrode 172.

The first protection layer 181 and the second protection layer 182 include, for example, nickel-chromium (NiCr). In detail, the first protection layer 181 and the second protection layer 182 may include, for example, nickel-chromium (NiCr) or a nickel-chromium alloy, and in a case of the nickel-chromium alloy, at least one selected from vanadium (V), titanium (Ti), zirconium (Zr), aluminum (Al), iron (Fe), indium (In), tantalum (Ta), manganese (Mn), magnesium (Mg), molybdenum (Mo), cobalt (Co), tin (Sn), tungsten (W), niobium (Nb), and neodymium (Nd) may be included in addition to nickel-chromium.

The first protection layer 181 and the second protection layer 182 prevent the resistivity metal layer included in the source electrode 171 and the drain electrode 172 from being oxidized.

As described, the first protection layer 181 and the second protection layer 182 according to an exemplary embodiment include nickel-chromium, and the nickel-chromium has a diffusion coefficient of about $1 \times 10^{-14}$ cm$^2$/sec at about 1200° C. such that nickel-chromium is not diffused into an adjacent material at a high temperature.

Accordingly, in a subsequent high temperature process, little reaction with the semiconductor layer is generated. Also, in a subsequent high temperature process, nickel-chromium is not diffused into the resistivity metal layer such as, for example, copper, aluminum, and silver. Accordingly, the resistivity increase of the source electrode and the drain electrode is prevented, and thereby the deterioration of the performance of the display device including the thin film transistor may be prevented.

Also, nickel-chromium of the first protection layer 181 and the second protection layer 182 has an excellent contact characteristic with the resistivity metal layer such as copper, aluminum, and silver, so that adherence between the layers is high.

Also, nickel-chromium included in the first protection layer 181 and the second protection layer 182 may be simultaneously etched along with the resistivity metal layer such as copper, aluminum, and silver using the same etchant such that the manufacturing process is simplified. In detail, nickel-chromium included in the first barrier layer 161 and the second barrier layer 162 may be etched using an etchant including, for example, phosphoric acid, nitric acid, or acetic acid. The etchant including phosphoric acid, nitric acid, or acetic acid may be used in repeated etching processes a greater number of times than an etchant of a different kind, thereby decreasing manufacturing cost.

Although not shown, a passivation layer may be disposed on the first protection layer 181 and the second protection layer 182 and on the channel region of the semiconductor layer 150 that is not overlapped by the source electrode 171 and the drain electrode 172.

Figure 3:
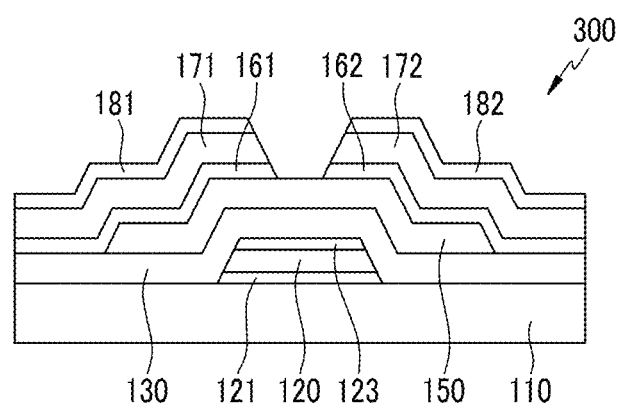
FIG. 3 is a cross-sectional view of a thin film transistor array panel according to another exemplary embodiment.

Next, referring to FIG. 3, another exemplary embodiment of the present invention will be described. FIG. 3 is a cross-sectional view of a thin film transistor array panel according to another exemplary embodiment of the present invention.

Referring to FIG. 3, the thin film transistor array panel 300 according to the present exemplary embodiment is similar to the thin film transistor array panel according to the exemplary embodiments shown in FIG. 1 and FIG. 2.

Referring to FIG. 3, the thin film transistor array panel 300 according to the present exemplary embodiment includes the insulation substrate 110, the gate electrode 120, the gate insulating layer 130, the semiconductor layer 150, the source electrode 171, the drain electrode 172, the first barrier layer 161 and the second barrier layer 162 disposed between the source electrode 171 and drain electrode 172 and the semiconductor layer 150, and the first protection layer 181 and the second protection layer 182 disposed on the source electrode 171 and the drain electrode 172.

However, the thin film transistor array panel 300 according to the present exemplary embodiment, differently from the thin film transistor array panel of the above exemplary embodiments, further includes a third barrier layer 121 disposed under the gate electrode 120 and a third protection layer 123 disposed on the gate electrode 120.

Also, the gate electrode 120 of the thin film transistor array panel 300 according to the present exemplary embodiment may be made of a metal having low resistivity such as, for example, a copper-containing metal including copper (Cu) and copper alloys, an aluminum-containing metal including aluminum (Al) and aluminum alloys, or a silver-containing metal including silver (Ag) and silver alloys.

Similar to the first barrier layer 161 and the second barrier layer 162, the third barrier layer 121 includes, for example, nickel-chromium (NiCr). In detail, the first barrier layer 161, the second barrier layer 162, and the third barrier layer 121 may include, for example, nickel-chromium (NiCr) or a nickel-chromium alloy, and in the case of the nickel-chromium alloy, at least one selected from, for example, vanadium (V), titanium (Ti), zirconium (Zr), aluminum (Al), iron (Fe), indium (In), tantalum (Ta), manganese (Mn), magnesium (Mg), molybdenum (Mo), cobalt (Co), tin (Sn), tungsten (W), niobium (Nb), and neodymium (Nd) may be included in addition to nickel-chromium.

The first barrier layer 161 and the second barrier layer 162 increase a contact characteristic between the semiconductor layer 150, and the source electrode 171 and the drain electrode 172, and prevent components of the source electrode 171 and the drain electrode 172 from reacting with components of the semiconductor layer 150. Similarly, the third barrier layer 121 increases the contact characteristic between the substrate 110 and the gate electrode 120, and prevents the components in the substrate 110 from being diffused into the gate electrode 120.

Similar to the first protection layer 181 and the second protection layer 182, the third protection layer 123 includes nickel-chromium (NiCr). In detail, the first protection layer 181, the second protection layer 182, and the third protection layer 123 may include, for example, nickel-chromium (NiCr) or a nickel-chromium alloy, and in the case of the nickel-chromium alloy, at least one selected from, for example, vanadium (V), titanium (Ti), zirconium (Zr), aluminum (Al), iron (Fe), indium (In), tantalum (Ta), manganese (Mn), magnesium (Mg), molybdenum (Mo), cobalt (Co), tin (Sn), tungsten (W), niobium (Nb), and neodymium (Nd) may be included in addition to nickel-chromium.

The first protection layer 181 and the second protection layer 182 prevent the component of the resistivity metal layer included in the source electrode 171 and the drain electrode 172 from being oxidized. Similarly, the third protection layer 123 may prevent the component of the resistivity metal layer included in the gate electrode 120 from being oxidized.

Although not shown, a passivation layer may be disposed on the first protection layer 181 and the second protection layer 182, and on the channel region of the semiconductor layer 150 that is not overlapped by the source electrode 171 and the drain electrode 172.

Next, an experimental example will be described with reference to Table 1. In the experimental example, peel strength is measured and a result thereof is represented in Table 1 for a case 1 in which wire is formed including copper on a substrate, and a case 2 in which wire including copper is formed after forming a barrier layer including nickel-chromium on the same substrate, as described for thin film transistor array panels according to an exemplary embodiments.

TABLE 1

|  | Peel strength (kgf/cm) |
| --- | --- |
| Case 1 | 0.13 |
| Case 2 | 0.75 |

Referring to Table 1, in case 2, in which the wire is formed with the barrier layer including nickel-chromium under the wiring, the peel strength is very much increased, such that the excellent contact characteristic may be obtained.

Figure 4A:
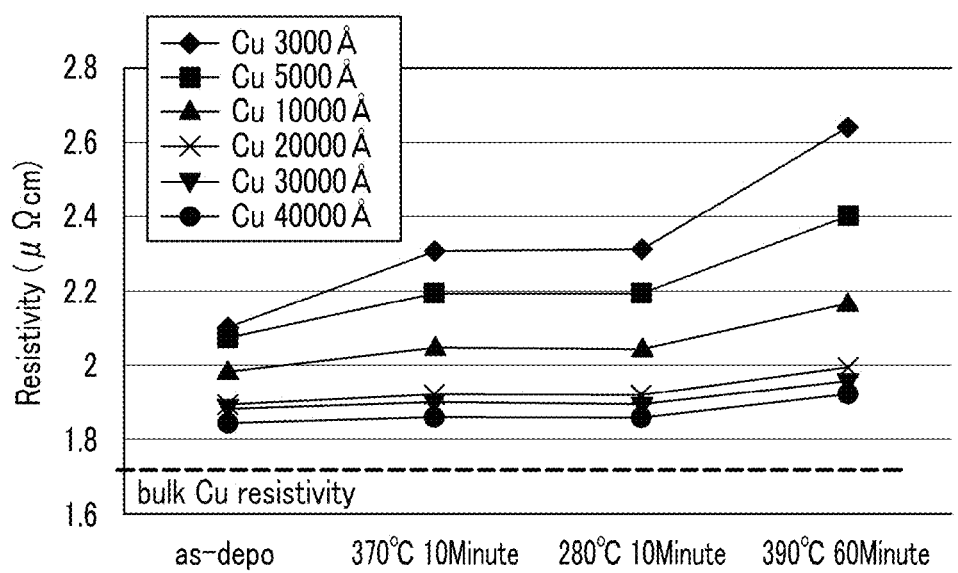
FIG. 4A and FIG. 4B are graphs showing resistivity of wiring according to one experimental example.
Figure 4B:
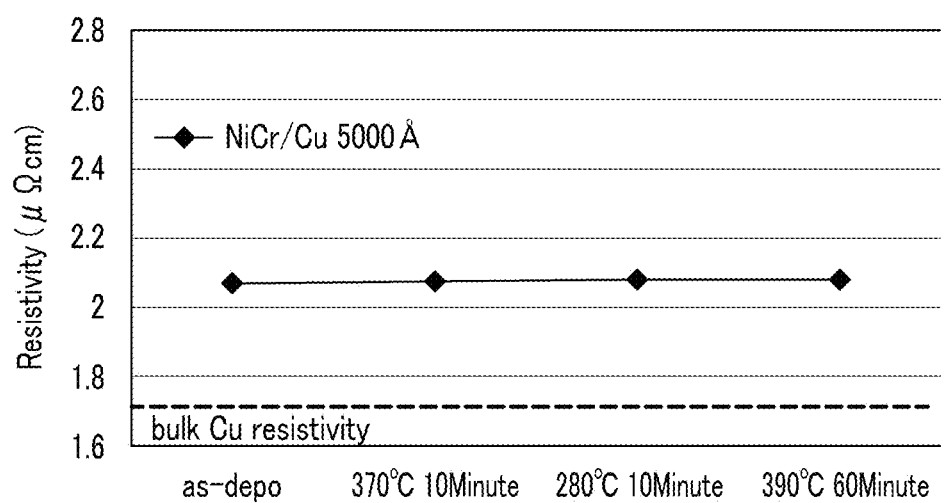

Next, referring to FIG. 4A and FIG. 4B, a result according to another experimental example will be described. FIG. 4A and FIG. 4B are graphs showing resistivity of wiring according to one experimental example.

FIG. 4A shows the results of tests performed on wiring such as would be used in a conventional thin film transistor array panel, in which wiring that includes copper (Cu) is formed over a barrier layer including titanium (Ti). The results shown in FIG. 4A are of resistivity measurements taken while performing heat treatments. FIG. 4B, on the other hand, shows the results of test performed on wiring according to an exemplary embodiment of the present invention in which wiring that includes copper (Cu) is formed over a barrier layer including nickel chromium. The results shown in FIG. 4B are of resistivity measurements taken while performing heat treatments. The remaining experimental conditions except for the component of the barrier layer are the same between the two figures.

Referring to FIG. 4A, as compared with the resistivity of the wiring as deposited (without further heat treatment—labeled as-depo in FIG. 4A), when performing the heat treatment, the resistivity of the wiring including copper is gradually increased. In particular, when the wiring is thinner, the resistivity value of the wiring is larger.

However, referring to FIG. 4B, as compared the resistivity of the wiring as deposited (without further heat treatment—labeled as-depo in FIG. 4B), when performing the heat treatment, the resistivity of the wiring including copper is not changed.

As described above, the thin film transistor array panel according to an exemplary embodiment includes a barrier layer including nickel-chromium and is disposed between the source electrode and the drain electrode, and the semiconductor, such that the reaction of the component of the source electrode and the drain electrode with the semiconductor layer may be prevented without a change of resistivity of the low resistivity metal included in the source electrode and the drain electrode in the subsequent heat treatment.

Figure 5:
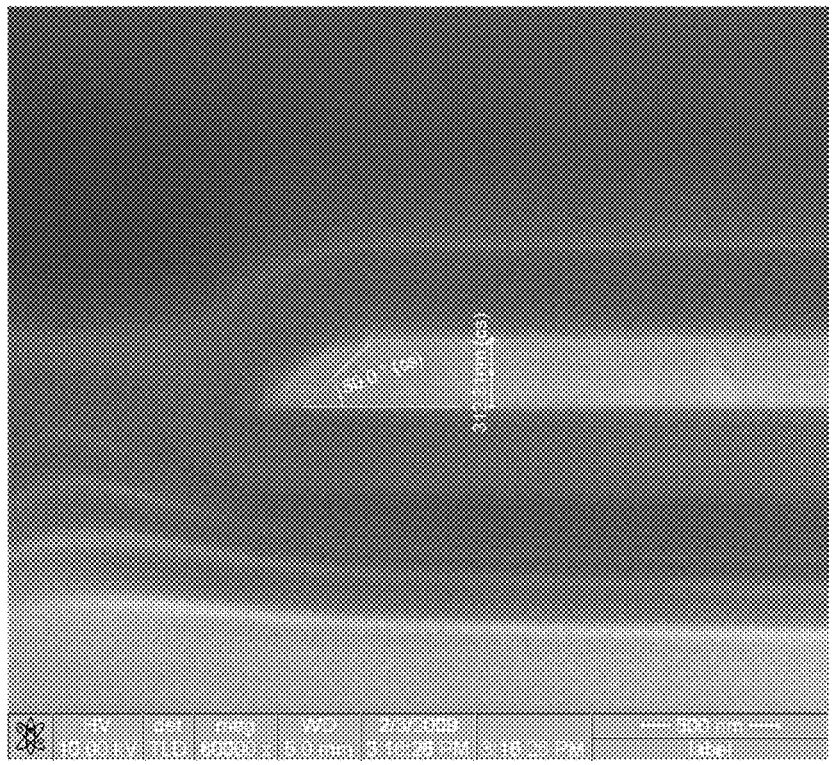
FIG. 5 is an electron micrograph showing a deposition result of wiring according to one experimental example.

Next, referring to FIG. 5, another experimental example will be described. FIG. 5 is an electron micrograph showing the result of depositing wiring according to one experimental example of the exemplary embodiments.

FIG. 5 is an electron micrograph showing the result of a wiring formed in the manner of a thin film transistor array panel according to an exemplary embodiment of the present disclosure, in which a wiring that includes copper (Cu) is formed over a barrier layer including nickel-chromium. To form the wiring, the nickel-chromium layer and the copper layer are sequentially deposited, and then simultaneously etched by using the same etchant, for example, an etchant including phosphoric acid, nitric acid, or acetic acid. The result is shown in FIG. 5 through the electron micrograph.

Referring to FIG. 5, as the barrier layer including nickel-chromium and the wiring layer including copper on the barrier layer they may be simultaneously etched, a pattern having an excellent profile may be obtained without an undercut of the nickel-chromium disposed under the copper. Accordingly, lifting of the wiring layer, such as at the source electrode and the drain electrode, due to the undercut of the underlying barrier layer generated in the conventional thin film transistor array panel may be prevented. Also, the barrier layer, the source electrode, and the drain electrode are patterned by using the same etchant at the same time such that the manufacturing process may be simplified and the manufacturing cost may be reduced. Also, the barrier layer and the source and drain electrodes may be etched by using the etchant including phosphoric acid, nitric acid, or acetic acid, which are capable of a greater number of repeated uses in etching processes than different kinds of etchants, and as a result manufacturing cost may be reduced.

As described above, in the thin film transistor array panel according to an exemplary embodiment, a barrier layer including nickel-chromium (NiCr) is formed between the source electrode and the drain electrode of the thin film transistor, and the oxide semiconductor, such that the adherence characteristic between the source electrode and the drain electrode, and the underlying layer, may be increased. Additionally, and unnecessary and undesirable reactions between the oxide semiconductor and the low resistivity metal may be prevented. Furthermore, diffusion between the barrier layer component and the low resistivity metal component is blocked such that reduction of the wiring resistivity of the source electrode and the drain electrode including the low resistivity metal may be prevented. Also, the low resistivity metal such as copper or aluminum and the barrier layer made of nickel-chromium may be etched by the same etchant, and as a result an undercut of the underlying layer among the input electrode and the output electrode of the thin film transistor and the barrier layer may be prevented, and the manufacturing cost may be decreased.

The thin film transistor array panel according to the above-described exemplary embodiments may be used for any flat panel displays including thin film transistors such as a liquid crystal display, an organic light emitting diode display device, an electrophoretic display, and an electronic ink display device.

While this disclosure describes what is presently considered to be practical exemplary embodiments, it is to be understood that the invention is not limited to the disclosed embodiments, but, on the contrary, is intended to cover various modifications and equivalent arrangements included within the spirit and scope of the disclosure including the appended claims.

DESCRIPTION OF SYMBOLS

| | |
|---|---|
| 110: insulation substrate | 120: gate electrode |
| 121: third barrier layer | 123: third protection layer |
| 130: gate insulating layer | 150: semiconductor layer |
| 161: first barrier layer | 162: second barrier layer |
| 171: source electrode | 172: drain electrode |
| 181: first protection layer | 182: second protection layer |

What is claimed is:

1. A thin film transistor array panel comprising:
a semiconductor layer disposed on an insulation substrate;
a gate electrode overlapping the semiconductor layer;
a source electrode and a drain electrode overlapping the semiconductor layer;
a first barrier layer disposed between the source electrode and the semiconductor layer;
a second barrier layer disposed between the drain electrode and the semiconductor layer,
a first protection layer disposed on a surface of the source electrode where the first barrier layer is not disposed among surfaces of the source electrode;
a second protection layer disposed on a surface of the drain electrode where the second barrier layer is not disposed among surfaces of the drain electrode, and
wherein the first barrier layer and the second barrier layer include nickel-chromium (NiCr) and the first protection layer and the second protection layer include nickel-chromium.

2. The thin film transistor array panel of claim 1, wherein the semiconductor includes an oxide semiconductor.

3. The thin film transistor array panel of claim 2, wherein the source electrode and the drain electrode include at least one of copper, aluminum, and silver.

4. The thin film transistor array panel of claim 3, wherein the first barrier layer and the second barrier layer include at least one element selected from vanadium (V), titanium (Ti), zirconium (Zr), aluminum (Al), iron (Fe), indium (In), tantalum (Ta), manganese (Mn), magnesium (Mg), chromium (Cr), molybdenum (Mo), cobalt (Co), nickel (Ni), tin (Sn), tungsten (W), niobium (Nb), and neodymium (Nd).

5. The thin film transistor array panel of claim 4 further comprising,
a third barrier layer disposed under the gate electrode,
wherein the gate electrode includes at least one of copper, aluminum, and silver, and wherein the third barrier layer includes nickel-chromium.

6. The thin film transistor array panel of claim 5, further comprising
a third passivation layer disposed on the gate electrode, and wherein the third passivation layer includes nickel-chromium.

7. The thin film transistor array panel of claim 1, wherein the source electrode and the drain electrode include at least one of copper, aluminum, and silver.

8. The thin film transistor array panel of claim 7, wherein the first barrier layer and the second barrier layer include at least one element selected from vanadium (V), titanium (Ti), zirconium (Zr), aluminum (Al), iron (Fe), indium (In), tantalum (Ta), manganese (Mn), magnesium (Mg), chromium (Cr), molybdenum (Mo), cobalt (Co), nickel (Ni), tin (Sn), tungsten (W), niobium (Nb), and neodymium (Nd).

9. The thin film transistor array panel of claim 8 further comprising,
a third barrier layer disposed under the gate electrode, wherein the gate electrode includes at least one of copper, aluminum, and silver, and wherein the third barrier layer includes nickel-chromium.

10. The thin film transistor array panel of claim 9, further comprising
a third passivation layer disposed on the gate electrode, and the third passivation layer includes nickel-chromium.

11. The thin film transistor array panel of claim 1, wherein the first barrier layer and the second barrier layer include at least one element selected from vanadium (V), titanium (Ti), zirconium (Zr), aluminum (Al), iron (Fe), indium (In), tantalum (Ta), manganese (Mn), magnesium (Mg), chromium (Cr), molybdenum (Mo), cobalt (Co), nickel (Ni), tin (Sn), tungsten (W), niobium (Nb), and neodymium (Nd).

12. The thin film transistor array panel of claim 11 further comprising,
a third barrier layer disposed under the gate electrode, wherein the gate electrode includes at least one of copper, aluminum, and silver, and wherein the third barrier layer includes nickel-chromium.

13. The thin film transistor array panel of claim 12, further comprising
a third passivation layer disposed on the gate electrode, and the third passivation layer includes nickel-chromium.

14. The thin film transistor array panel of claim 1 further comprising,
a third barrier layer disposed under the gate electrode, wherein the gate electrode includes at least one of copper, aluminum, and silver, and wherein the third barrier layer includes nickel-chromium.

15. The thin film transistor array panel of claim 14 further comprising
a third passivation layer disposed on the gate electrode, and the third passivation layer includes nickel-chromium.

* * * * *